(12) United States Patent
Pass

(10) Patent No.: US 11,784,270 B2
(45) Date of Patent: Oct. 10, 2023

(54) SOLAR MODULE INTERCONNECT

(71) Applicant: Maxeon Solar Ptd. Ltd., Singapore (SG)

(72) Inventor: Thomas Pass, San Jose, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 122 days.

(21) Appl. No.: 16/859,846

(22) Filed: Apr. 27, 2020

(65) Prior Publication Data

US 2020/0259031 A1 Aug. 13, 2020

Related U.S. Application Data

(63) Continuation of application No. 14/555,292, filed on Nov. 26, 2014, now Pat. No. 10,636,924.

(51) Int. Cl.
*H01L 31/05* (2014.01)
*H01L 31/0224* (2006.01)
*H01L 31/0352* (2006.01)

(52) U.S. Cl.
CPC .. *H01L 31/0512* (2013.01); *H01L 31/022433* (2013.01); *H01L 31/0352* (2013.01); *H01L 31/0516* (2013.01); *Y02E 10/50* (2013.01)

(58) Field of Classification Search
CPC ....... H01L 31/05–0516; H01L 31/0508; H01L 31/0684
See application file for complete search history.

(56) References Cited

U.S. PATENT DOCUMENTS

| 3,268,366 A | 8/1966 | Guyot | |
|---|---|---|---|
| 3,411,952 A * | 11/1968 | Bernd | H01L 23/48 136/244 |
| 3,527,619 A | 9/1970 | Miley | |
| 3,620,847 A | 11/1971 | Wise | |
| 4,633,030 A | 12/1986 | Cook | |
| 4,972,770 A | 5/1990 | Swanson | |
| 5,011,544 A | 4/1991 | Gaddy et al. | |
| 5,053,083 A | 10/1991 | Sinton | |
| 5,100,808 A | 3/1992 | Glenn | |
| 5,131,956 A | 7/1992 | Oohara | |
| 5,164,019 A | 11/1992 | Sinton | |
| 5,360,990 A | 11/1994 | Swanson | |
| 5,369,291 A | 11/1994 | Swanson | |

(Continued)

FOREIGN PATENT DOCUMENTS

| JP | 62105484 A | 5/1987 | |
|---|---|---|---|
| WO | WO-2009049572 A1 * | 4/2009 | H01L 31/05 |

(Continued)

OTHER PUBLICATIONS

Machine translation of WO2013/161030A1 (Year: 2013).*

(Continued)

*Primary Examiner* — Ryan S Cannon
(74) *Attorney, Agent, or Firm* — Schwabe, Williamson & Wyatt, P.C.

(57) ABSTRACT

A solar module can include a first and second solar cell having front sides which face the sun during normal operation and back sides opposite the front sides. In an embodiment, a first interconnect can be coupled to the back sides of both the first and second solar cell, where the first interconnect comprises an anodized region facing substantially the same direction as the front sides.

15 Claims, 7 Drawing Sheets

(56) References Cited

U.S. PATENT DOCUMENTS

| | | | |
|---|---|---|---|
| 5,660,646 | A | 8/1997 | Kataoka et al. |
| 5,667,596 | A * | 9/1997 | Tsuzuki ............... H01L 31/048 |
| | | | 136/244 |
| 5,681,402 | A | 10/1997 | Ichinose et al. |
| 6,274,402 | B1 | 8/2001 | Verlinden et al. |
| 6,313,395 | B1 | 11/2001 | Crane et al. |
| 6,333,457 | B1 | 12/2001 | Mulligan et al. |
| 6,337,283 | B1 | 1/2002 | Verlinden et al. |
| 6,387,726 | B1 | 5/2002 | Verlinden et al. |
| 6,423,568 | B1 | 7/2002 | Verlinden et al. |
| 7,390,961 | B2 | 6/2008 | Aschenbrenner et al. |
| 2001/0029976 | A1 * | 10/2001 | Takeyama ........... H01L 31/0512 |
| | | | 136/244 |
| 2003/0102227 | A1 | 6/2003 | Billi et al. |
| 2005/0268959 | A1 | 12/2005 | Aschenbrenner et al. |
| 2010/0108123 | A1 | 5/2010 | Asberg et al. |
| 2011/0272006 | A1 * | 11/2011 | Sainoo ................ H01L 31/0516 |
| | | | 136/251 |
| 2013/0112233 | A1 * | 5/2013 | Coakley .............. H01L 31/0516 |
| | | | 136/244 |
| 2013/0206210 | A1 | 8/2013 | Niinobe et al. |
| 2013/0340804 | A1 | 12/2013 | Moon et al. |
| 2014/0002881 | A1 | 1/2014 | Kim |
| 2014/0102515 | A1 | 4/2014 | Sakuma et al. |
| 2014/0166098 | A1 | 6/2014 | Kian et al. |
| 2014/0190546 | A1 * | 7/2014 | Fukumochi ..... H01L 31/022441 |
| | | | 136/244 |
| 2014/0246068 | A1 | 9/2014 | Krokoszinski et al. |
| 2014/0342236 | A1 | 11/2014 | Goyal |
| 2014/0366928 | A1 | 12/2014 | Niinobe et al. |
| 2015/0059831 | A1 | 3/2015 | Fukumochi |
| 2015/0207003 | A1 | 7/2015 | Woo et al. |

FOREIGN PATENT DOCUMENTS

| | | | | |
|---|---|---|---|---|
| WO | WO-2012176516 | A1 | 12/2012 | |
| WO | WO-2013018533 | A1 * | 2/2013 | ......... H01L 31/0508 |
| WO | WO-2013161030 | A1 * | 10/2013 | ..... H01L 31/022441 |
| WO | WO-2012046319 | A1 | 2/2014 | |
| WO | WO-2013161030 | A1 | 12/2015 | |
| WO | WO-2013168612 | A1 | 1/2016 | |

OTHER PUBLICATIONS

Machine translation of WO2009/049572A1 (Year: 2009).*
Definition of "chamfer" [retrieved from https://www.thefreedictionary.com/chamfer on Dec. 12, 2019.
"Flipper Turbot Build Sheet" website, http://www.iwgoerlich.solarbotics.net/robots/flipper/build.sub.-sheet.ht-m, illustrating worcompleted in Oct. 2003, 4 pages. k
"Flipper" website http://iwgoerlich.solarbotics.net/robots/flipper/default.htm. Illustrating work completed in Oct. 2003, 1 page.
D.M. Considine, ed., "Van Nostrand's Scientific Encyclopedia", New York: Van Nostrand Reinhold, p. 1096. (1989) Entry on "Ethylene-Vinyl-Acetate Copolymers".
C.W. Paul, "Hot-Melt Adhesives" MRS Bulletin., Jun. 2003, pp. 440-444.
Website "Adhesives 101", http://www.glue-store.com/adhesives101.html from Jun. 5, 2002, available from www.archives.org. 6 pages.
Website "CSE Distributors PVC Tape", http://www.csedistributors.com/acatalog/PVC.sub.-Tape.html from Oct. 12, 2002, available from www.archive.org 2 pages.
W.P. Mulligan, et al., "A Flat-Plate Concentrator: Micro-Concentrator Design Overview", 2000, 3 sheets: Proceedings of the 28.sup.th IEEE PVSC.
Keith R. McIntosh, et al., "The Choice of Silicon Water for the Production of Low-Cost Rear-Contact Solar Cells", May 2003, 4 sheets; Sunnyvale, California.
P.J. Verlinden, et al., "Will We Have a 20%-Efficient (PTC) Photovoltaic System?", 2001, 6 sheets; Proceedings of the 17.sub.th Europe Photovoltaic Solar Energy Conference.
William P. Mulligan, et al., "Development of Chip-Size Silicon Solar Cells", 6 sheets; Proceedings of the 28.sup.th IEEE PVSC.
Akira Terao, et al., "A Mirror-Less Design for Micro-Concentrator Modules", 2000, 4 Sheets; Proceedings of the 28.sup.th IEEE PVSC.
P.J. Verlinden, et al., "Backside-Contact Silicon Solar Cells with Improved Efficiency for the '96 World Solar Challenge", 1997, 5 sheets Proceedings of the 15sup.th EPSEC.
P.J. Veriinden, et al., "One-Year Comparison of a Concentrator Module with Silicon Point-Contact Solar Cell to a Fixed Flat Module in Northern California", 2000, 4 Sheets; Proceedings of the 16.sup.th EPSEC.
Richard M. Swanson, "The Promise of Concentrators", 2000, pp. 93-111, Progress in Photovoltaics: Research and Applications.
First Action Interview Pilot Program Pre-Interview Communication from U.S. Appl. No. 14/555,292 dated Apr. 6, 2017, 16 pgs.
First Action Interview Office Action from U.S. Appl. No. 14/555,292 dated Jun. 16, 2017, 14 pgs.
Final Office Action from U.S. Appl. No. 14/555,292 dated Nov. 17, 2017, 15 pgs.
Non-Final Office Action from U.S. Appl. No. 14/555,292 dated Jun. 8, 2018, 17 pgs.
Final Office Action from U.S. Appl. No. 14/555,292 dated Jan. 7, 2019, 15 pgs.
Non-Final Office Action from U.S. Appl. No. 14/555,292 dated Jul. 5, 2019, 16 pgs.

* cited by examiner

SOLAR MODULE INTERCONNECT

CROSS-REFERENCE TO RELATED APPLICATIONS

This application is a continuation of U.S. patent application Ser. No. 14/555,292, filed on Nov. 26, 2014, the entire contents of which are hereby incorporated by reference herein.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the solar cell to an external circuit. When PV cells are combined in an array such as a PV module, the electrical energy collect from all of the PV cells can be combined in series and parallel arrangements to provide power with a certain voltage and current.

Solar cells can be interconnected together in series via interconnects to provide a string of solar cells, which in turn can be connected in series to form a solar module.

DETAILED DESCRIPTION

Figure 1:
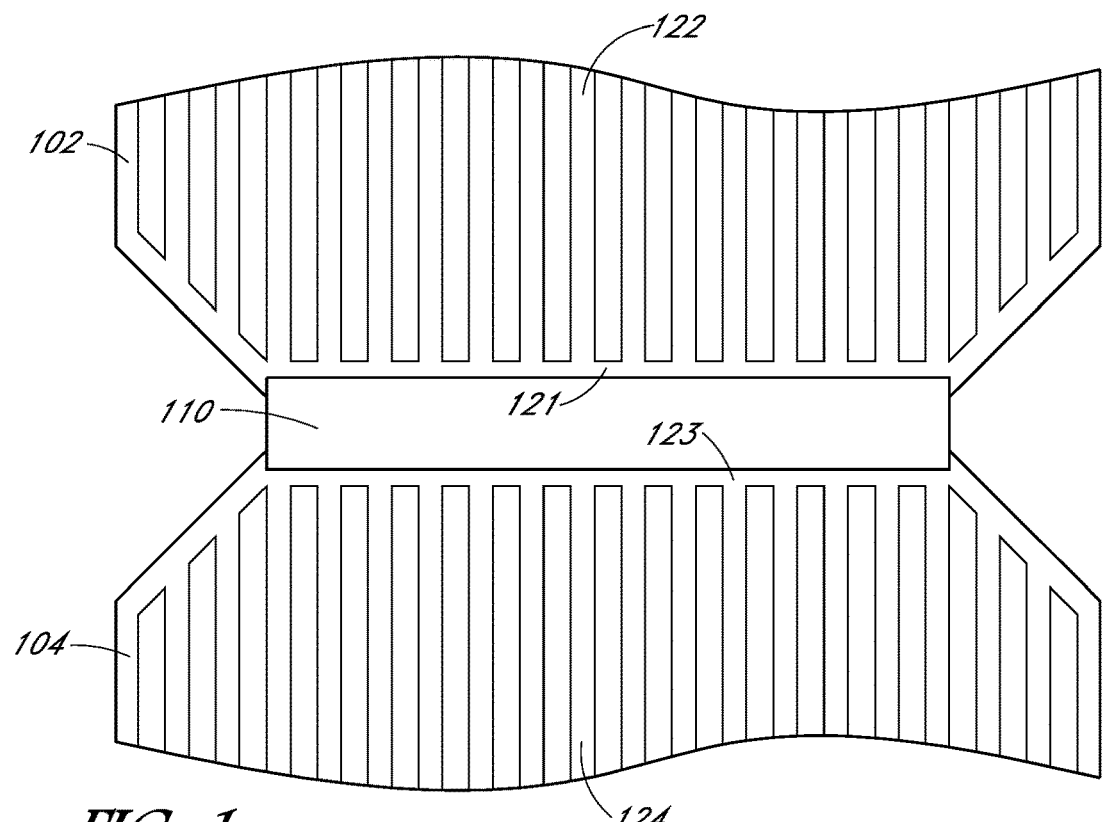
FIG. 1 illustrates the back sides of example solar cells connected together by an interconnect, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" interconnect does not necessarily imply that this interconnect is the first interconnect in a sequence; instead the term "first" is used to differentiate this interconnect from another interconnect (e.g., a "second" interconnect). As used wherein, interconnects can be a metal, e.g. an aluminum interconnect, which connect a solar cell to another solar cell. In an embodiment, the interconnect can electrically and/or structurally connect at least two solar cells together.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification first describes an example solar cell interconnect that can include an anodized region, followed by a more detailed explanation of various embodiments of an interconnect having anodized regions. Various examples are provided throughout.

Turning to FIG. 1, an example of solar cells connected together by a first interconnect having an anodized region is shown, according to some embodiments. In an embodiment, FIG. 1 shows the solar cells 102, 104 from back sides of the solar cells 102, 104, where the solar cells 102, 104 can have front sides which face the sun during normal operation and back sides is opposite the front sides. As shown, the solar cells 102, 104 in the example of FIG. 1 are pad-less solar cells in that the n and p fingers do not terminate into pads as opposed to solar cells having pads (e.g., 3 n-metal pads on one side of the backside of the solar cell and 3 p-metal pads on the other side of the backside of the solar cell). In the example pad-less solar cells 102, 104 shown in FIG. 1, the n and p fingers can take up more surface area of the backside of the solar cell, which can result in additional collected current and therefore additional efficiency.

In an embodiment, the first interconnect 110 can connect a first solar cell 102 to a second solar cell 104. In one embodiment, to connect pad-less solar cells 102, 104 together, a tab-less interconnect can be used, such as the one illustrated in FIG. 1. In an embodiment, the first interconnect 110 can be welded to metal regions 121, 123 of the solar cells 102, 104. In some embodiments, the metal regions of the solar cells 102, 104 can be disposed above the solar cells, whereas in other embodiments, the metal regions 121, 123 of the solar cell can extend past the wafer such that the interconnect is welded to the cell metal off cell.

In some embodiments, a laser process can be used to weld the first interconnect 110 to metal regions 121, 123 of the first and second solar cell 102, 104. In an example, the metal regions 121, 123 can include contact fingers 122, 124, which as noted above, can extend off wafer or not extend off wafer.

In one embodiment, first interconnect 110 can be a conductive foil or other type of conductive material. The interconnect can include aluminum, silver, copper, etc. (e.g. an aluminum interconnect). In an embodiment, the first interconnect 110 can be substantially planar with the metal regions 121, 123 and/or the first and second solar cell 102, 104. In an embodiment, the first interconnect 110 can have a layer of nickel and/or zincate. In one embodiment, the layer of nickel and/or zincate can be formed by a cladding process.

In one embodiment, the first interconnect 110 can include an anodized region. For example, the anodized region can be on a side of the first interconnect 110 facing the front side of the solar cell.

Figure 2:
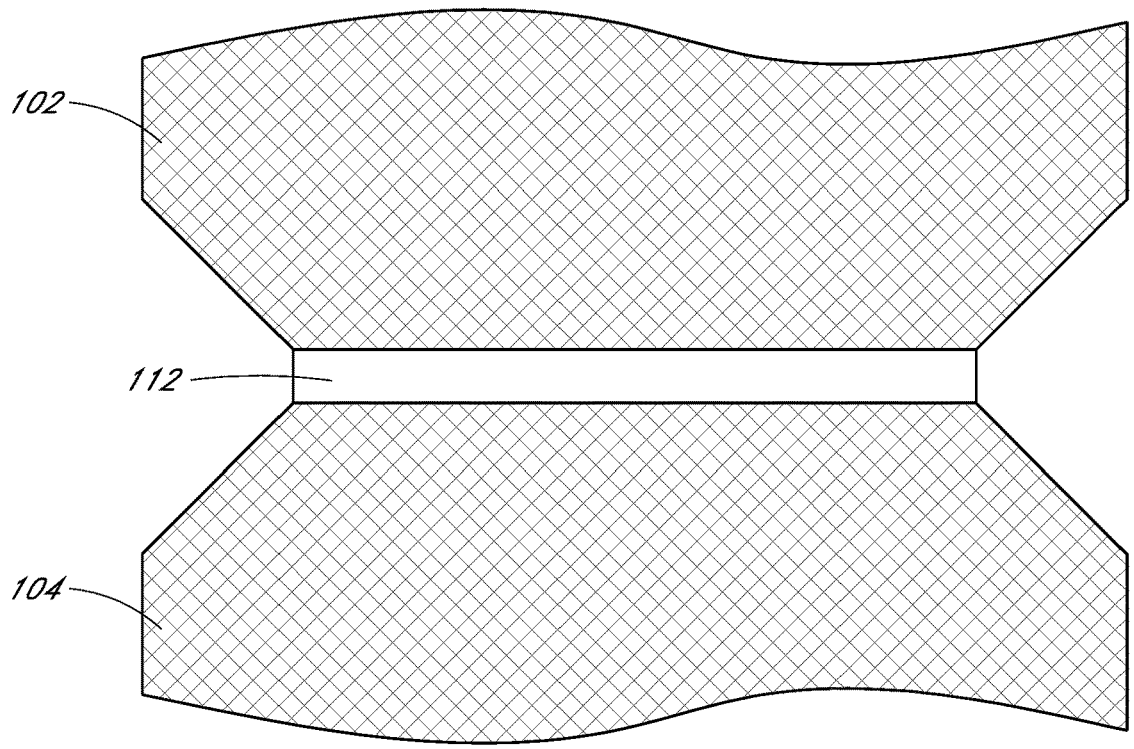
FIG. 2 illustrates the front sides of the solar cells of FIG. 1, according to some embodiments.

FIG. 2 illustrates the example solar cells of FIG. 1 as viewed from front sides of the solar cells, according to some embodiments. In an embodiment, the first interconnect 110 of FIG. 1 can have an anodized region 112. In one embodiment, the anodized region 112 can enhance the rigidity and/or provide structural support to the first interconnect 110. In an embodiment, the anodized region 112 can inhibit the first interconnect 110 from bending or otherwise distorting during processing, such as during the lamination process. In some embodiments, the anodized region 112 can insulate the first interconnect 110 (e.g. be an insulating region).

In one embodiment, the anodized region 112 can have substantially the same color as a backsheet of a solar module such that when viewed from the front of the module, the visible portion of the interconnect (e.g., the anodized region) blends in, aesthetically speaking, with the backsheet. In some embodiments, the anodized region 112 can electrically insulate portions of the first interconnect. In an embodiment, the anodized region 112 can have substantially the same reflectance as the backsheet.

Although region 112 is referred to as an anodized region throughout the specification for ease of understanding, in some embodiments, region 112 can instead be a powder-coated region. In an embodiment, the powder-coated region can include a polymer coating. In one embodiment, the powder-coated region can enhance the rigidity and/or provide structural support to the first interconnect 110. In some embodiments, the powder-coated region can insulate the first interconnect 110. In an embodiment, the powder-coated region can have substantially the same color as a backsheet of a solar module. In an embodiment, the powder-coated region can have substantially the same reflectance as the backsheet.

In contrast to systems in which a separate material is between the tabbed interconnect and solar cell to accommodate coupling the tabs of the interconnect to the pads of the solar cell, the anodized region may not add substantially to the thickness of the interconnect such that it can still be substantially coplanar with the solar cell metal.

Figure 3:
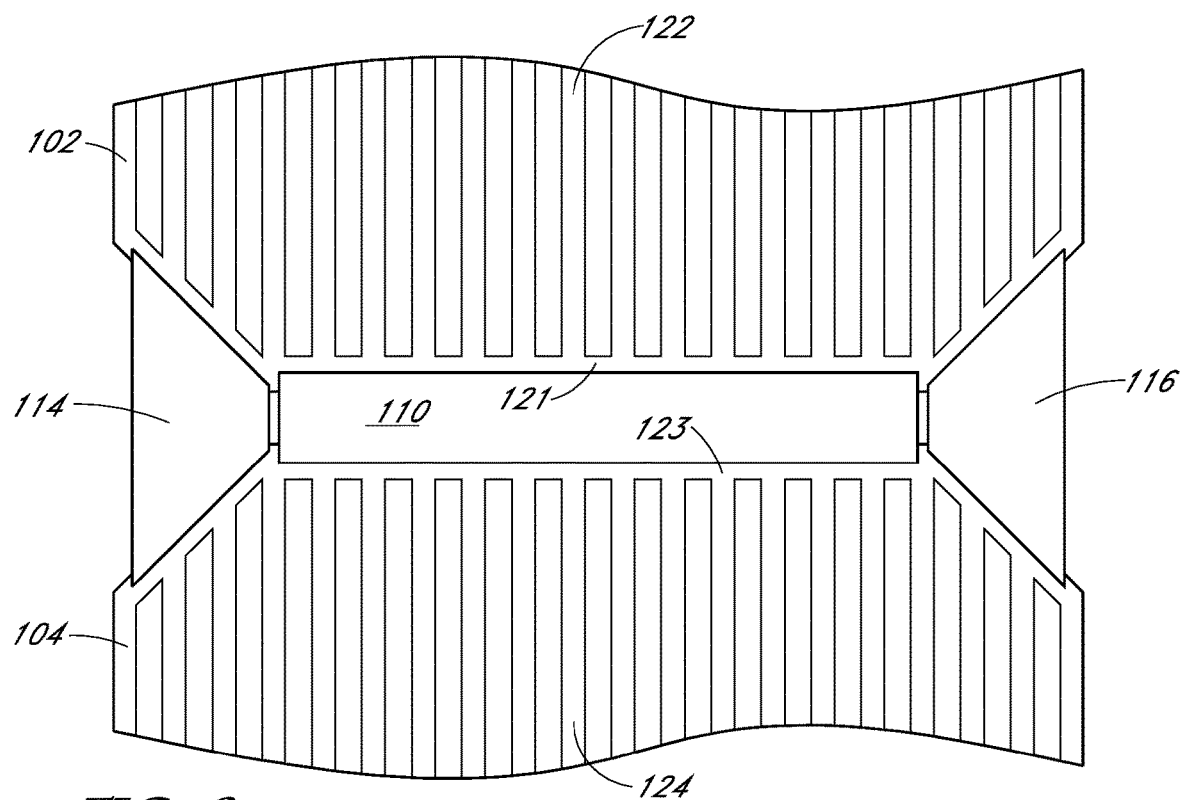
FIG. 3 illustrates the back sides of example of solar cells connected together by a plurality of interconnects, according to some embodiments.
Figure 4:
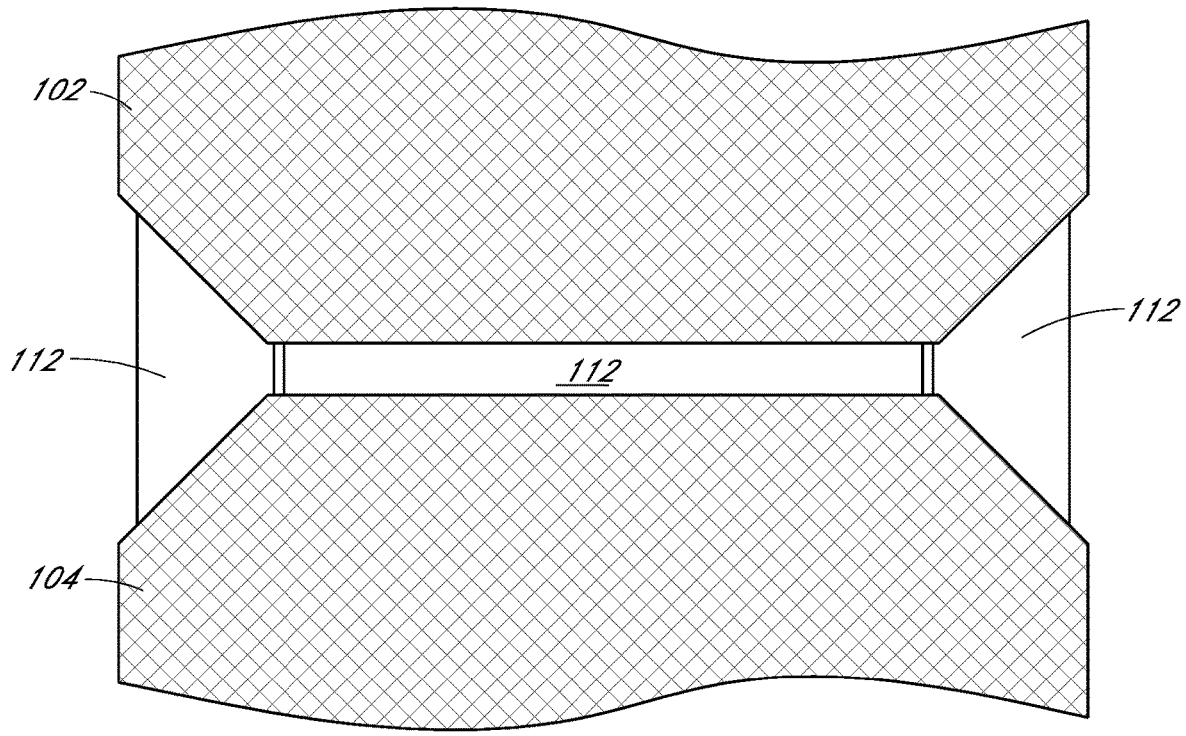
FIG. 4 illustrates the front sides of the solar cells of FIG. 3, according to some embodiments.

With reference to FIGS. 3 and 4, an example of solar cells connected together by a plurality interconnects having an anodized regions are shown, according to some embodiments. Unless otherwise specified below, the numerical indicators used to refer to components in FIGS. 3 and 4 are similar to those used to refer to components or features in FIGS. 1 and 2. Additionally, unless specified otherwise, the description above at FIGS. 1 and 2 apply equally to the remaining Figures.

FIG. 3 illustrates an example of solar cells connected together by multiple separate interconnects with anodized regions, for example, a first, second and third interconnect having anodized regions, according to some embodiments. In an embodiment, the first, second and third interconnects 110, 114, 116 can connect a first solar cell 102 to a second solar cell 104. As shown, the solar cells in the example of FIG. 3 are pad-less solar cells, 102, 104.

In an embodiment, the first, second and third interconnects 110, 144, 116 can be welded to metal regions 121, 123 of the solar cells 102, 104, which, as was the case above, can be off cell or over the cell. In some embodiments, a laser process can be used to weld the first, second and third interconnect 110, 114, 116 to metal regions 121, 123 of the first and second solar cell 102, 104. In an example, the metal regions 121, 123 can include contact fingers 122, 124. In one embodiment, first, second and third interconnects 110, 114, 116 can be aluminum. In an embodiment, the first, second and third interconnect 110, 114, 116 can be substantially planar with the metal regions 121, 123 and/or the first and second solar cell 102, 104. In one embodiment, to connect pad-less solar cells 102, 104 together, tab-less interconnects 110, 114, 116 can be used, such as the one illustrated in FIG. 3. In an embodiment, the first, second and third interconnect 110, 114, 116 can have a layer of nickel and/or zincate. In one embodiment, the layer of nickel and/or zincate can be formed by a cladding process.

With reference to FIG. 4, the example solar cells of FIG. 3 as viewed from front sides of the solar cells are shown, according to some embodiments. In an embodiment, the first, second and third interconnects 110, 114, 116 of FIG. 3 can have an anodized region 112. As described above, the anodized region 112 can enhance the rigidity and/or provide structural support to the interconnects, can inhibit the interconnects from bending or otherwise distorting, and/or can be configured to insulate the interconnects (e.g. be an insulating region). In one embodiment, the anodized region 112 can have substantially the same color as a backsheet of a solar module. In an embodiment, the anodized region 112 can have substantially the same reflectance as the backsheet. In some embodiments, the anodized region 112 can electrically insulate portions of the first, second and third interconnect 110, 114, 116.

In one embodiment, the anodized region 112 can instead be a powder-coated region. In an embodiment, the powder-coated region can include a polymer coating. In one embodiment, the powder-coated region can enhance the rigidity and/or provide structural support to the first, second and third interconnect 110, 114, 116. In some embodiments, the powder-coated region can insulate the first, second and third interconnect 110, 114, 116. In an embodiment, the powder-coated region can have substantially the same color as a backsheet of a solar module. In an embodiment, the powder-coated region can have substantially the same reflectance as the backsheet.

Generally speaking, the pseudo corners of the solar cells can be difficult to collect current from. In a pad-less solar cell design, instead of having to navigate current from the pseudo corner to a pad, the solar cell metal from the pseudo corner can be coupled to an interconnect in the diamond region between cells as shown by interconnects 114 and 116 in FIGS. 3 and 4.

Figure 5:
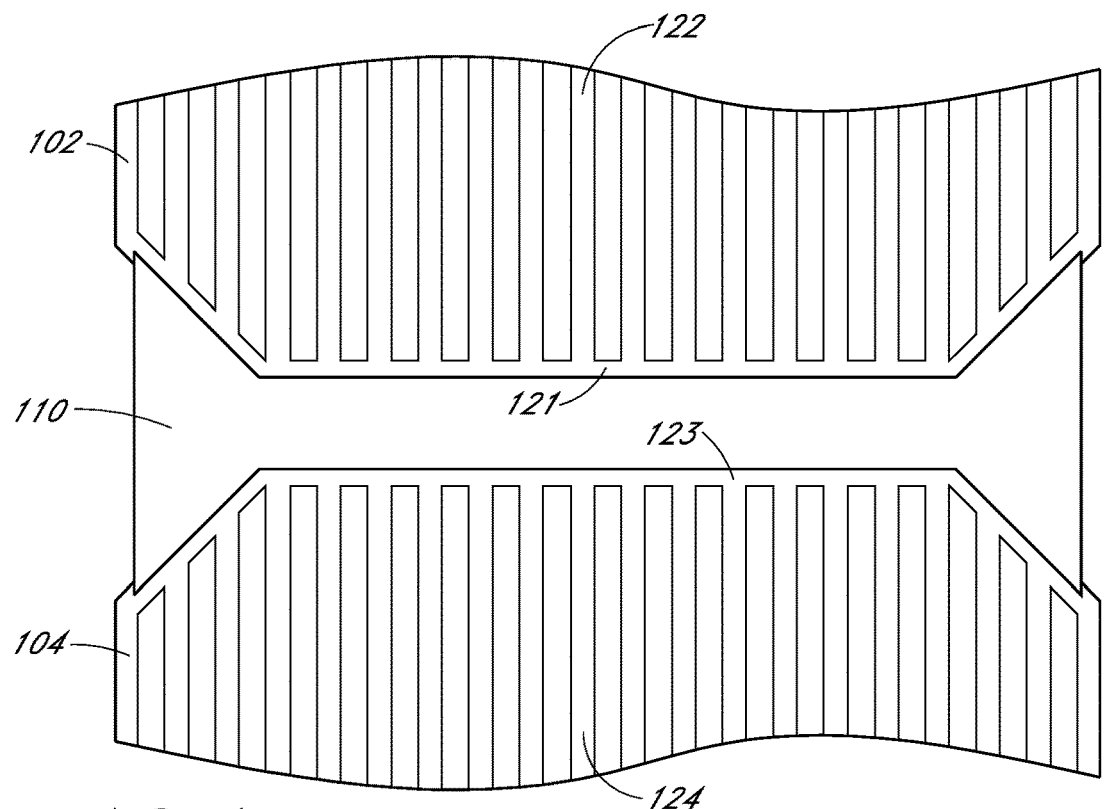
FIG. 5 illustrates the back sides of example of solar cells connected together by another interconnect, according to some embodiments.

FIG. 5 illustrates another example of solar cells connected together by a first interconnect having an anodized region, according to some embodiments. In one embodiment, the first interconnect 110 can have a dog-bone shape as shown. FIG. 5 is a similar shape to the example of FIG. 3 except that it is a single interconnect having that shape rather than multiple interconnects collectively having that shape. As shown, the solar cells in the example of FIG. 5 are pad-less solar cells 102, 104. In an embodiment, the first interconnect 110 can be welded to metal regions 121, 123 of the solar cells 102, 104. In some embodiments, a laser process can be used to weld the first interconnect 110 to metal regions 121, 123 of the first and second solar cell 102, 104. In an example, the metal regions 121, 123 can include contact fingers 122, 124. In one embodiment, first interconnect 110 can be aluminum. In an embodiment, the first interconnect 110 can be substantially planar with the metal regions 121, 123 and/or the first and second solar cell 102, 104. In one embodiment, to connect pad-less solar cells 102, 104 together, a tab-less interconnect can be used, such as the one illustrated in FIG. 5. In an embodiment, the first interconnect 110 can have a layer of nickel and/or zincate. In one embodiment, the layer of nickel and/or zincate can be formed by a cladding process.

Figure 6:
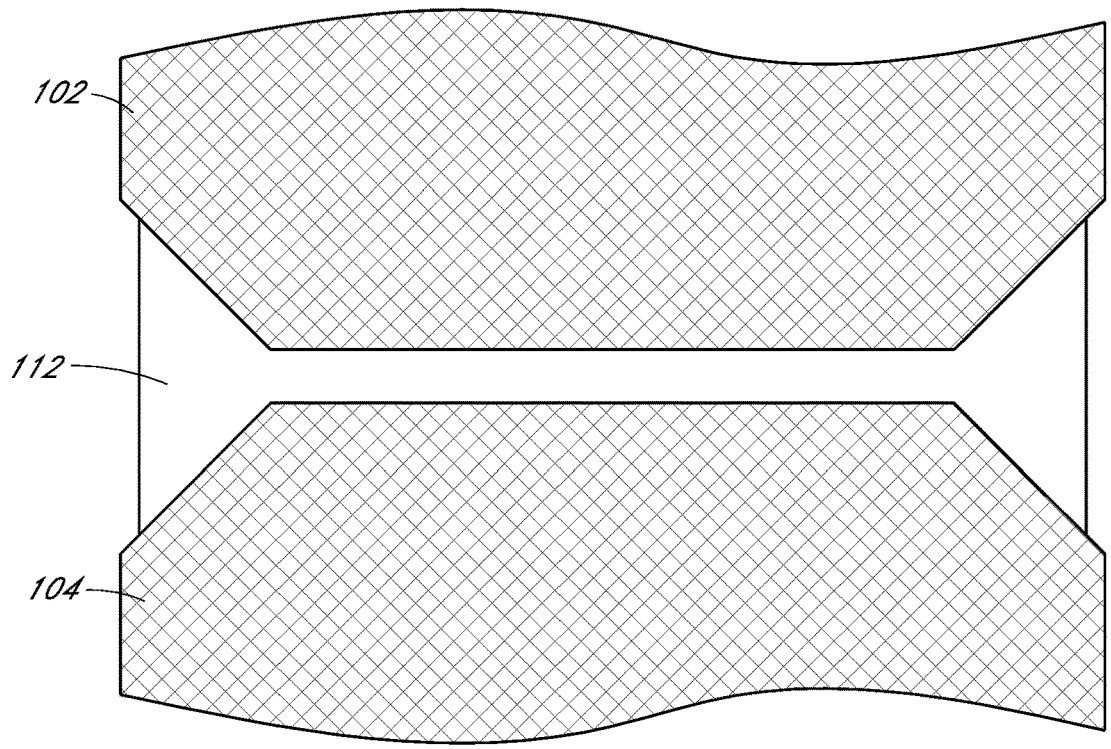
FIG. 6 illustrates the front sides of the solar cells of FIG. 5, according to some embodiments.

With reference to FIG. 6, example solar cells of FIG. 5 as viewed from front sides of the solar cells are shown, according to some embodiments. As shown, the first interconnect 110 of FIG. 5 can have an anodized region 112. In one embodiment, the anodized region 112 can enhance the rigidity and/or provide structural support to the first interconnect 110. In an embodiment, the anodized region 112 can inhibit the first interconnect 110 from bending or otherwise distorting during processing, such as during the lamination process. In some embodiments, the anodized region 112 can insulate the first interconnect 110 (e.g. be an insulating region).

In one embodiment, the anodized region 112 can have substantially the same color as a backsheet of a solar module. In an embodiment, the anodized region 112 can have substantially the same reflectance as the backsheet. In some embodiments, the anodized region 112 can electrically insulate portions of the first interconnect 110.

Although region 112 is referred to as an anodized region throughout the specification for ease of understanding, in some embodiments, region 112 can instead be a powder-coated region. In an embodiment, the powder-coated region can include a polymer coating. In one embodiment, the powder-coated region can enhance the rigidity and/or provide structural support to the first interconnect 110. In some embodiments, the powder-coated region can insulate the first interconnect 110. In an embodiment, the powder-coated region can have substantially the same color as a backsheet of a solar module. In an embodiment, the powder-coated region can have substantially the same reflectance as the backsheet.

Figure 7:
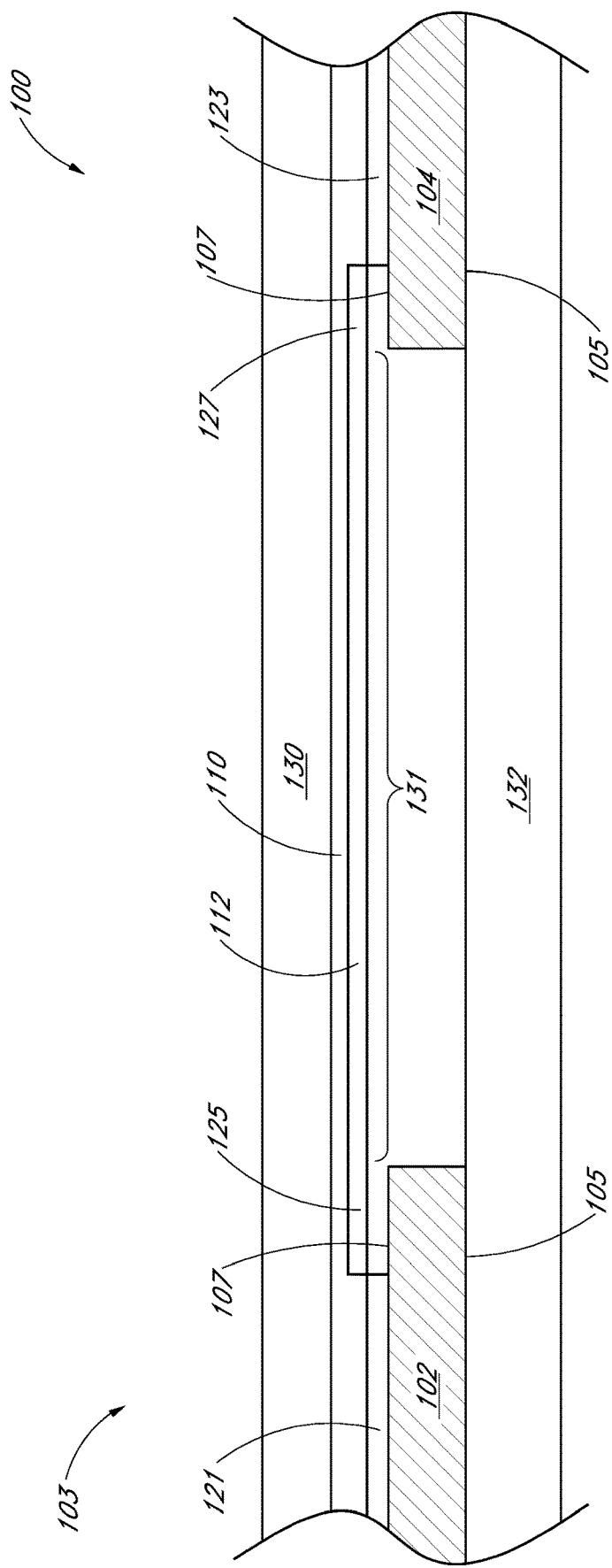
FIG. 7 illustrates a cross-sectional view of the solar cells of FIGS. 1-6, according to some embodiments.

FIG. 7 illustrates a cross-sectional view of the solar cells of FIGS. 1-6, according to some embodiments. Unless otherwise specified below, the numerical indicators used to refer to components in FIGS. 1-6 are similar to those used to refer to components or features in FIG. 7.

With reference to FIG. 7, a cross-sectional view of the solar cells of FIGS. 1-6 are shown, according to some embodiments. In an embodiment, the solar cells 102, 104 can be formed in a solar module 100, where the solar module 100 can include a backsheet 130 and a substantially transparent cover 132 (e.g. glass). In one embodiment, the solar module 100 can have a front side 101 facing the sun during normal operation and a back side 103 opposite the front side 101. In an embodiment, the front sides 105 of the solar cells 102, 104 can face substantially the same direction as the front side 101 of the solar module 100. In an embodiment, the solar cells 102, 104 can also have back sides 107 opposite the front sides 105. In an embodiment, a first interconnect 110 can connect the first solar cell 102 to the second solar cell 104.

In one embodiment, the first interconnect 110 can have an anodized region 112. In an embodiment the anodized region 112 can be located between the solar cells 102, 104 and the first interconnect 110. In some embodiments, the anodized region 112 can be located on an exposed region 131 of the first interconnect 110. In an embodiment, the exposed region 131 can be a portion of the first interconnect 110 that can be viewed from the front sides 101, 105 of the solar module 100 and/or solar cells 102, 104. In one embodiment, a portion 125, 127 of the anodized region 112 can be disposed above the first and second solar cells 102, 104 as shown. In an embodiment, the anodized region 112 can inhibit bending or otherwise distorting during processing. In some embodiments, the anodized region 112 can insulate the first interconnect 110.

In an embodiment, the first interconnect 110 can be connected to metal regions 121, 123 of the solar cells 102, 104. In one embodiment, the anodized region 112 can have substantially the same color as a backsheet 130 of the solar module 100 such that when viewed from the front of the module, the visible portion of the interconnect (e.g., the anodized region) blends in, aesthetically speaking, with the backsheet 130. In an embodiment, the anodized region 112 can have substantially the same reflectance as the backsheet.

In one embodiment, the anodized region 112 can be substantially black or white. In one embodiment, the backsheet 120 can also be substantially black or white. In an embodiment, the anodized region 112 can have substantially the same color as the backsheet 130. In an embodiment, the anodized region 112 can have substantially the same reflectance as the backsheet 130.

Although region 112 is referred to as an anodized region throughout the specification, the anodized region 112 can instead be a powder-coated region. In an embodiment, the powder-coated region can include a polymer coating. In one embodiment, the powder-coated region can enhance the rigidity and/or provide structural support to the first interconnect 110. In some embodiments, the powder-coated region can insulate the first interconnect 110. In an embodiment, the powder-coated region can have substantially the same color as the backsheet 130 of a solar module 100. In an embodiment, the powder-coated region can have substantially the same reflectance as the backsheet 130.

Figure 8:
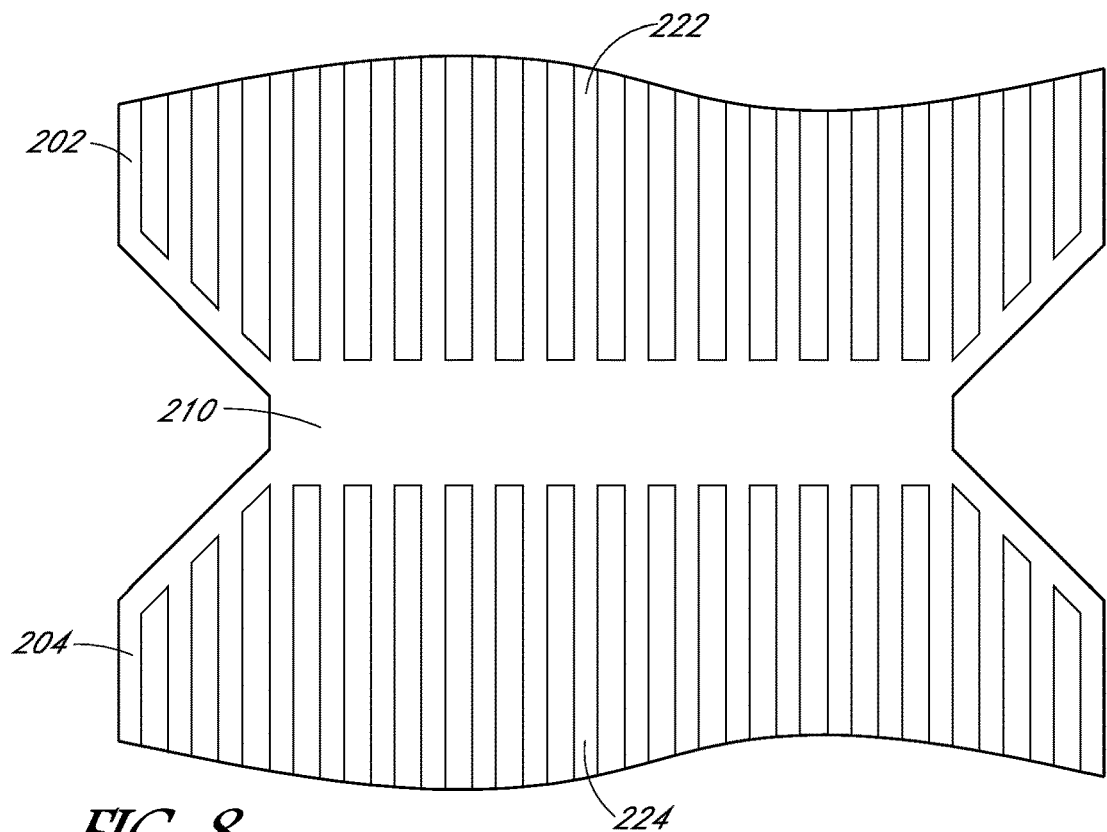
FIG. 8 illustrates the back sides of example solar cells connected together by a conductive foil, according to some embodiments.

Turning to FIG. 8, example of solar cells connected together by a conductive foil having an anodized region are shown, according to some embodiments. In an embodiment, FIG. 8 shows the solar cells 202, 204 from back sides of the solar cells 202, 204, where the solar cells 202, 204 can have front sides which face the sun during normal operation and back sides is opposite the front sides. In an embodiment, the conductive foil 210 can connect a first solar cell 202 to a second solar cell 204. As shown, the solar cells 202, 204 in the example of FIG. 8 are pad-less solar cells 202, 204. In an embodiment, the conductive foil 210 can include contact fingers 222, 224. In one embodiment, conductive foil 210 can be aluminum. In an example, the conductive foil 210 can be an aluminum foil. In some embodiments, the conductive foil 210 can be rolled over from the first solar cell 202 to the second solar cell 204. In some embodiments, a laser process can be used to weld the conductive foil 210 to the first and second solar cell 202, 204. In an embodiment, the conductive foil 210 can have a layer of nickel and/or zincate. In one embodiment, the layer of nickel and/or zincate can be formed by a cladding process.

Figure 9:
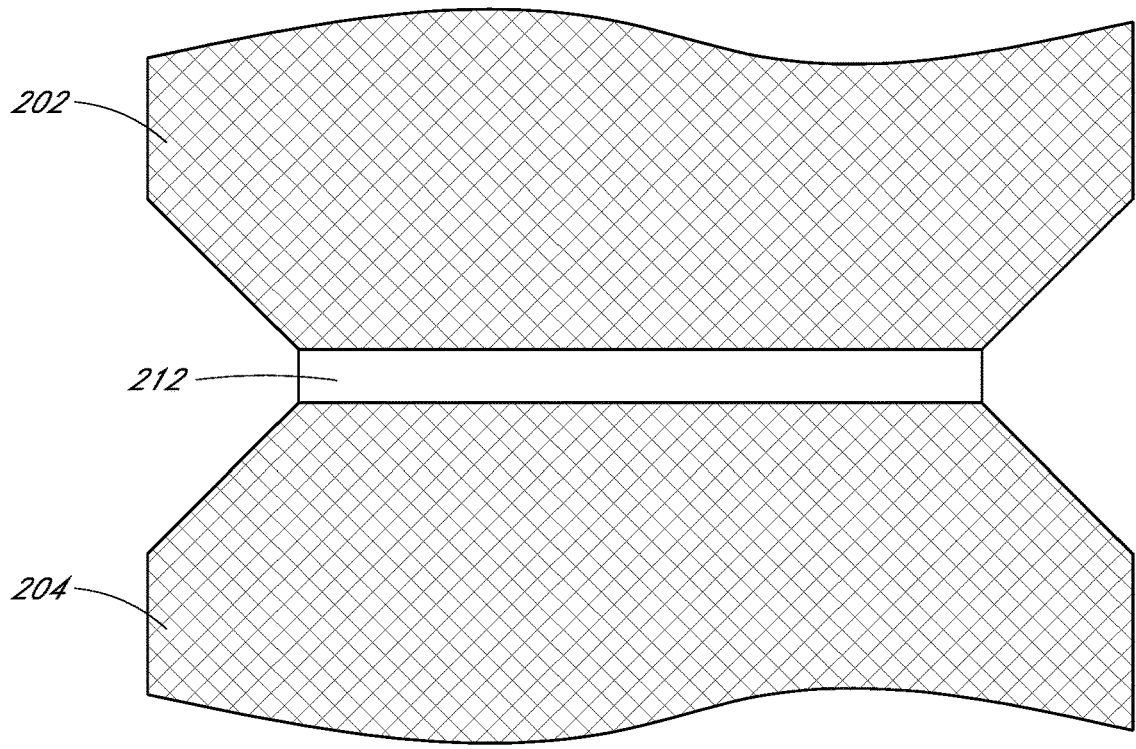
FIG. 9 illustrates the front sides of the solar cells of FIG. 8, according to some embodiments.

FIG. 9 illustrates the example solar cells of FIG. 8 as viewed from front sides of the solar cells, according to some embodiments. In an embodiment, the conductive foil 210 of FIG. 8 can have an anodized region 212. In one embodiment, the anodized region 212 can enhance the rigidity and/or provide structural support to the conductive foil 210. In an embodiment, the anodized region 212 can inhibit the first interconnect 210 from bending or otherwise distorting during processing, such as during the lamination process. In some embodiments, the anodized region 212 can insulate the first interconnect 210 (e.g. be an insulating region).

In one embodiment, the anodized region 212 can have substantially the same color as a backsheet of a solar module such that when viewed from the front of the module, the visible portion of the conductive foil (e.g., the anodized region) blends in, aesthetically speaking, with the backsheet. In an embodiment, the anodized region 212 can have substantially the same reflectance as the backsheet.

Although region 212 is referred to as an anodized region throughout the specification for ease of understanding, in some embodiments, region 212 can instead be a powder-coated region. In an embodiment, the powder-coated region can include a polymer coating. In one embodiment, the powder-coated region can enhance the rigidity and/or provide structural support to the conductive foil 210. In some embodiments, the powder-coated region can insulate the conductive foil 210. In an embodiment, the powder-coated region can have substantially the same color as a backsheet of a solar module. In an embodiment, the powder-coated region can have substantially the same reflectance as the backsheet.

Additionally, unless specified otherwise, the description above at FIGS. 8 and 9 apply equally to the remaining Figures.

Figure 10:
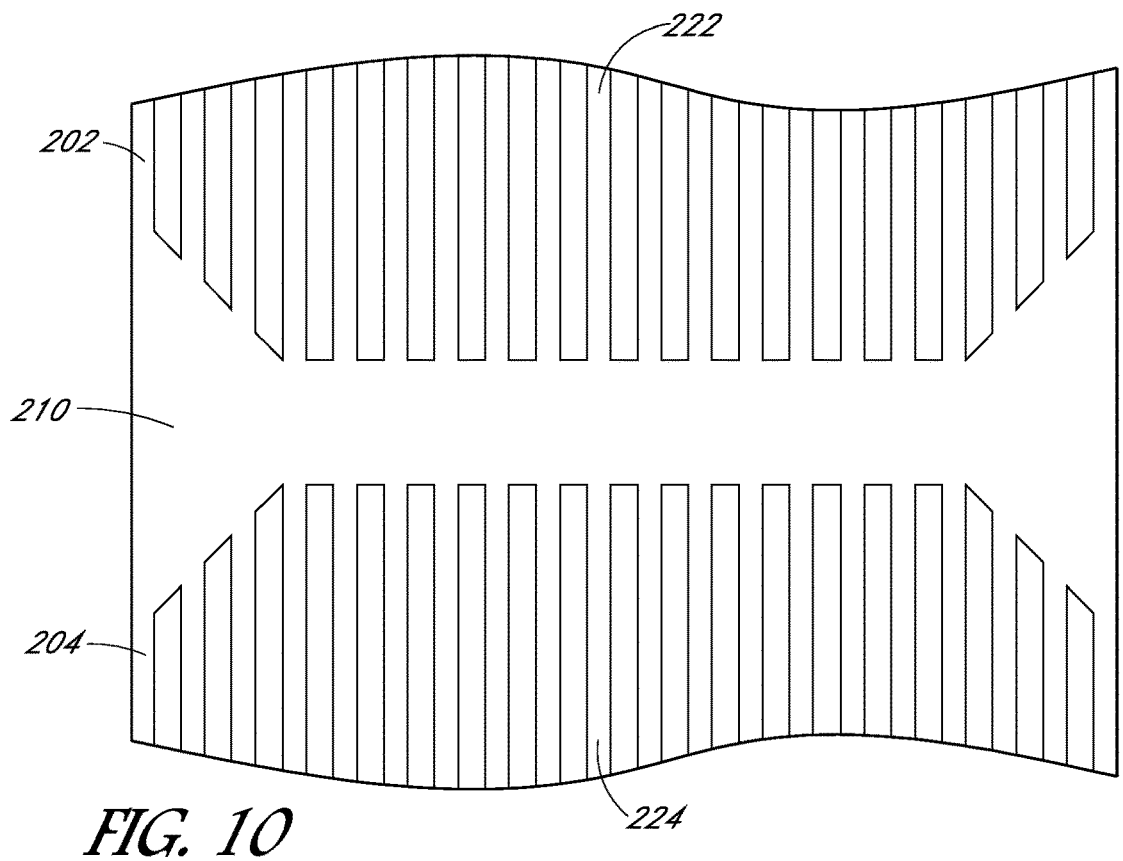
FIG. 10 illustrates the back sides of example of solar cells connected together by another conductive foil, according to some embodiments.
Figure 11:
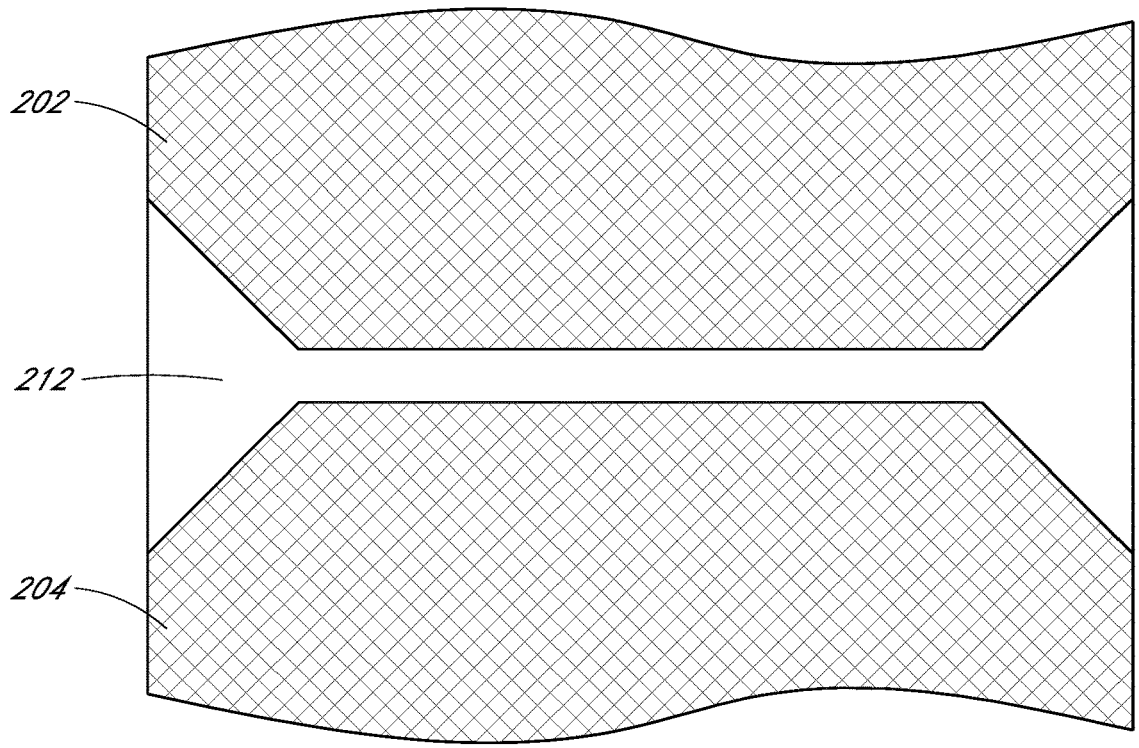
FIG. 11 illustrates the front sides of the solar cells of FIG. 10, according to some embodiments.

With reference to FIGS. 10 and 11, another example of solar cells connected together by a conductive foil having an anodized region are shown, according to some embodiments. Unless otherwise specified below, the numerical indicators used to refer to components in FIGS. 10 and 11 are similar to those used to refer to components or features in FIGS. 8 and 9.

FIG. 10 illustrates another example of solar cells connected together by a conductive foil having an anodized region, according to some embodiments. In an embodiment, a conductive foil 210 can connect a first solar cell 202 to a second solar cell 204. As shown, the solar cells 202, 204 in the example of FIG. 10 are pad-less solar cells 202, 204. In an embodiment, the conductive foil 210 can include contact fingers 222, 224. In one embodiment, conductive foil 210 can be aluminum. In some embodiments, the conductive foil 210 can be rolled over from the first solar cell 202 to the second solar cell 204.

With reference to FIG. 11, the example solar cells of FIG. 10 as viewed from front sides of the solar cells are shown, according to some embodiments. As shown, the conductive foil 210 of FIG. 10 can have an anodized region 212. In one embodiment, the anodized region 212 can enhance the rigidity and/or provide structural support to the conductive foil 210. In an embodiment, the anodized region 212 can inhibit the conductive foil 210 from bending or otherwise distorting during processing. In some embodiments, the anodized region 212 can insulate the conductive foil.

In one embodiment, the anodized region 212 can have substantially the same color as a backsheet of a solar module such that when viewed from the front of the module, the visible portion of the conductive foil (e.g., the anodized region) blends in, aesthetically speaking, with the backsheet. In an embodiment, the anodized region 212 can have substantially the same reflectance as the backsheet. In some embodiments, the anodized region 212 can electrically insulate portions of the conductive foil.

Although region 212 is referred to as an anodized region throughout the specification for ease of understanding, in some embodiments, region 212 can instead be a powder-coated region. In an embodiment, the powder-coated region can include a polymer coating. In one embodiment, the powder-coated region can enhance the rigidity and/or provide structural support to the conductive foil 210. In some embodiments, the powder-coated region can insulate the conductive foil 210. In an embodiment, the powder-coated region can have substantially the same color as a backsheet of a solar module. In an embodiment, the powder-coated region can have substantially the same reflectance as the backsheet.

Figure 12:
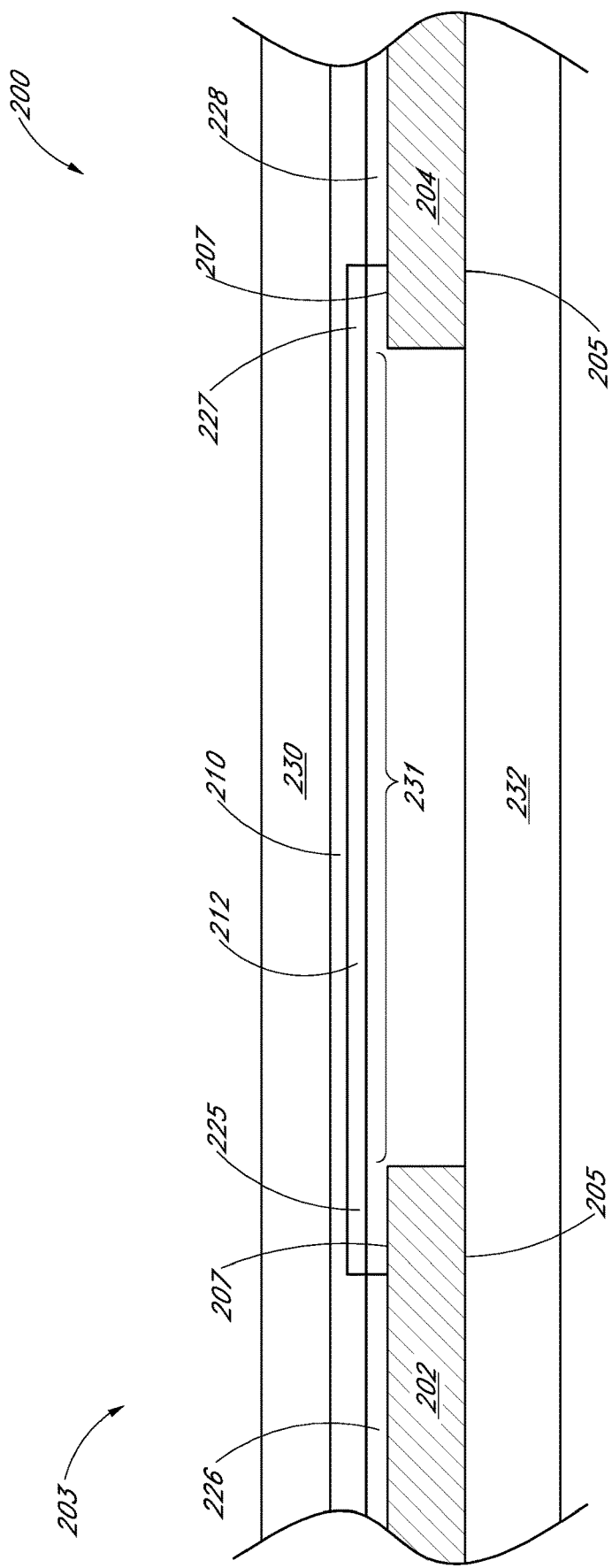
FIG. 12 illustrates a cross-sectional view of the solar cells of FIGS. 8-11, according to some embodiments.

With reference to FIG. 12, a cross-sectional view of the solar cells of FIGS. 8-11 are shown, according to some embodiments. Unless otherwise specified below, the numerical indicators used to refer to components in FIGS. 8-11 are similar to those used to refer to components or features in FIG. 12.

FIG. 12 illustrates a cross-sectional view of the solar cells of FIGS. 8-11, according to some embodiments. In an embodiment, the solar cells 202, 204 can be formed in a solar module 200, where the solar module 200 can include a backsheet 230 and a substantially transparent cover 232 (e.g. glass). In one embodiment, the solar module 200 can have a front side 201 which faces the sun during normal operation and a back side 203 opposite the front side 201. In an embodiment, the front sides 205 of the solar cells 202, 204 can face substantially the same direction as the front side 201 of the solar module 200. In an embodiment, the solar cells 202, 204 can also have back sides 207 opposite the front sides 205. In an embodiment, the conductive foil 210 can connect the first solar cell 202 to the second solar cell 204.

In one embodiment, the conductive foil 210 can have an anodized region 212. In an embodiment the anodized region 212 can be located between the solar cells 202, 204 and the conductive foil 210. In some embodiments, the anodized region 212 can be located on an exposed region 231 of the conductive foil 210. In an embodiment, the exposed region 231 can be a portion of the conductive foil 210 that can be viewed from the front sides 201, 205 of the solar module 200 and/or solar cells 202, 204. In one embodiment, a portion 225, 227 of the anodized region 212 can be disposed above the first and second solar cells 202, 204 as shown. In an embodiment, the anodized region 212 can inhibit bending or otherwise distorting during processing. In some embodiments, the anodized region 212 can insulate the conductive foil 210.

In an embodiment, the conductive foil 210 can be connected to semiconductor regions 226, 228 of the solar cells 202, 204. In an embodiment, the conductive foil 210 can be substantially planar with the solar cells 202, 204. In an example, the conductive foil 210 can be rolled over the first and second solar cell 202, 204. In one embodiment, the anodized region 212 can be configured to enhance the rigidity and/or provide structural support to the conductive foil 210.

In one embodiment, the anodized region 212 can be substantially black or white. In one embodiment, the backsheet 220 can also be substantially black or white. In an embodiment, the anodized region 212 can have substantially the same color as the backsheet 230. In an embodiment, the anodized region 212 can have substantially the same reflectance as the backsheet 230.

In one embodiment, the anodized region 212 can instead be a powder-coated region. In an embodiment, the powder-coated region can include a polymer coating. In one embodiment, the powder-coated region can enhance the rigidity and/or provide structural support to the conductive foil 210. In some embodiments, the powder-coated region can insulate the conductive foil 210. In an embodiment, the powder-coated region can have substantially the same color as a backsheet 230 of the solar module 200. In an embodiment, the powder-coated region can have substantially the same reflectance as the backsheet 230.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A plurality of connected solar cells, comprising:
   first and second pad-less solar cells having front surfaces which face the sun during normal operation and back surfaces opposite the front surface;
   a first tab-less interconnect comprising a conductive foil welded to and partially disposed on metal regions adjacent along a center portion of the first and second solar cells, the first tab-less interconnect comprising a dog-bone shape, wherein the first tab-less interconnect is located along and planar across the center portion of the first and second solar cells, and wherein the first tab-less interconnect has a total length that extends along less than an entirety of the center portion of the first and second solar cells and that extends along less than an entirety of the metal regions; and
   an anodized region facing substantially the same direction as the front surfaces, the anodized region having a widest width less than a narrowest width of the first tab-less interconnect.

2. The plurality of connected solar cells of claim 1 wherein the first tab-less interconnect comprises a material selected from the group consisting of aluminum, nickel and zincate.

3. The plurality of connected solar cells of claim 1, wherein the front surface and the back surface of each pad-less solar cell have corresponding chamfered corners.

4. The plurality of connected solar cells of claim 1, wherein the first tab-less interconnect is substantially planar with the metal regions.

5. The plurality of connected solar cells of claim 1, wherein the first tab-less interconnect is facing substantially the same direction as the front surfaces.

6. The plurality of connected solar cells of claim 1, wherein the anodized region comprises a color substantially the same as a color of a backsheet of the plurality of connected solar cells.

7. A plurality of connected solar cells, comprising:

first and second pad-less solar cells having front surfaces which face the sun during normal operation and back surfaces opposite the front surface;

a first tab-less interconnect comprising a conductive foil welded to and partially disposed on metal regions adjacent along a center portion of the first and second solar cells, the metal regions extending away from the center portion of the first and second solar cells, and the first tab-less interconnect comprising a dog-bone shape, wherein the first tab-less interconnect is located along and planar across the center portion of the first and second solar cells, and wherein the first tab-less interconnect has a total length that extends along less than an entirety of the center portion of the first and second solar cells and that extends along less than an entirety of the metal regions; and an anodized region facing substantially the same direction as the front surfaces, the anodized region having a widest width less than a narrowest width of the first tab-less interconnect.

8. The plurality of connected solar cells of claim 7, wherein the first tab-less interconnect comprises a material selected from the group consisting of aluminum, nickel and zincate.

9. The plurality of connected solar cells of claim 7, wherein the front surface and the back surface of each pad-less solar cell have corresponding chamfered corners.

10. The plurality of connected solar cells of claim 7, wherein the first tab-less interconnect is substantially planar with the metal regions.

11. The plurality of connected solar cells of claim 7, wherein the first tab-less interconnect is facing substantially the same direction as the front surfaces.

12. The plurality of connected solar cells of claim 7, wherein the anodized region comprises a color substantially the same as a color of a backsheet of the plurality of connected solar cells.

13. A plurality of connected solar cells, comprising:

first and second solar cells having front surfaces which face the sun during normal operation and back surfaces opposite the front surfaces, wherein the front surface and the back surface of each solar cell have corresponding chamfered corners;

a first tab-less interconnect comprising a conductive foil welded to and partially disposed on metal regions adjacent along a center portion of the first and second solar cells, the first tab-less interconnect comprising a dog-bone shape, wherein a portion of the conductive foil is positioned on and between facing chamfered corners of the first and second solar cells, and wherein the first tab-less interconnect is located along and planar across the center portion of the first and second solar cells, and wherein the first tab-less interconnect has a total length that extends along less than an entirety of the center portion of the first and second solar cells and that extends along less than an entirety of the metal regions; and an anodized region facing substantially the same direction as the front surfaces, the anodized region having a widest width less than a narrowest width of the first tab-less interconnect.

14. The plurality of connected solar cells of claim 13, wherein the first tab-less interconnect comprises a material selected from the group consisting of aluminum, nickel and zincate.

15. The plurality of connected solar cells of claim 13, wherein the anodized region comprises a color substantially the same as a color of a backsheet of the solar module.

* * * * *